(12) United States Patent
Tabuchi

(10) Patent No.: US 6,796,444 B2
(45) Date of Patent: Sep. 28, 2004

(54) FRONT RAIL IN SUB-RACK

(75) Inventor: Hiroshi Tabuchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/774,622

(22) Filed: Feb. 1, 2001

(65) Prior Publication Data

US 2002/0011525 A1 Jan. 31, 2002

(30) Foreign Application Priority Data

Jul. 28, 2000 (JP) .................................... 2000-229678

(51) Int. Cl.$^7$ ................................................ A47F 5/00
(52) U.S. Cl. .................... 211/183; 211/41.18; 361/759; 403/387
(58) Field of Search .................... 211/183, 41.17, 211/41.18, 26; 361/752, 759, 754, 801, 756, 802; 403/387; 312/752, 759, 754, 801, 756

(56) References Cited

U.S. PATENT DOCUMENTS

| | | | | |
|---|---|---|---|---|
| 3,098,177 A | * | 7/1963 | Bleier et al. | 361/802 |
| 3,234,704 A | * | 2/1966 | Burgess et al. | 52/731 |
| 4,002,381 A | * | 1/1977 | Wagner et al. | 312/183 |
| 4,201,303 A | * | 5/1980 | Smith | 211/41 |
| 4,407,416 A | * | 10/1983 | Anderson | 211/41 |
| 4,429,937 A | | 2/1984 | Stockmaster | |
| 4,534,472 A | * | 8/1985 | Hanseler et al. | 211/41 |
| 4,568,796 A | * | 2/1986 | Lebailly et al. | 174/52 R |
| 4,643,319 A | * | 2/1987 | Debus et al. | 211/189 |
| 4,669,616 A | * | 6/1987 | Mazura | 211/41 |
| 5,154,300 A | * | 10/1992 | Joist | 211/41 |
| 5,156,280 A | * | 10/1992 | Joist | 211/41 |
| 5,170,894 A | * | 12/1992 | Joist et al. | 211/41 |
| 5,293,303 A | * | 3/1994 | Fletcher et al. | 361/798 |
| 5,375,724 A | * | 12/1994 | Mazura | 211/26 |
| 5,406,455 A | * | 4/1995 | Devenish, III | 361/752 |
| 5,735,411 A | * | 4/1998 | Flamme et al. | 211/26 |
| 5,805,429 A | * | 9/1998 | Andersson | 361/799 |
| 5,940,276 A | * | 8/1999 | Kurrer et al. | 361/754 |
| 5,971,511 A | * | 10/1999 | Diebel et al. | 312/265.3 |
| 6,128,187 A | * | 10/2000 | Mimlitch, III et al. | 361/690 |
| 6,128,198 A | * | 10/2000 | Kurrer et al. | 361/759 |
| 6,178,092 B1 | * | 1/2001 | Billenstein et al. | 361/759 |
| 6,230,541 B1 | * | 5/2001 | Mimlitch et al. | 72/379.2 |
| 6,231,142 B1 | * | 5/2001 | Pochet | 312/265.3 |
| 6,238,025 B1 | * | 5/2001 | Kern et al. | 312/223.2 |
| 6,246,585 B1 | * | 6/2001 | Gunther et al. | 361/759 |
| 6,266,253 B1 | * | 7/2001 | Kurrer et al. | 361/796 |
| 6,398,042 B1 | | 6/2002 | Tabuchi | |

FOREIGN PATENT DOCUMENTS

| | | |
|---|---|---|
| DE | 89 06 492 | 8/1989 |
| FR | 1 453 283 | 6/1966 |
| JP | 59-016182 | 1/1984 |
| JP | 3-101299 | 4/1991 |

OTHER PUBLICATIONS

U.S. patent application Ser. No. 09/774,622, Tabuchi, filed Feb. 1, 2001.
U.S. patent application Ser. No. 10/332,984, Ureshino, filed Jan. 23, 2003.

* cited by examiner

*Primary Examiner*—Leslie A. Braun
*Assistant Examiner*—Khoa Tran
(74) *Attorney, Agent, or Firm*—Oblon, Spivak, McClelland, Maier & Neustadt, P.C.

(57) ABSTRACT

A front rail is formed by bending a steel sheet. The front rail has a front part having a hole, the hole allowing insertion of a dowel pin arranged on a printed circuit board, a top part mounting a guide rail for guiding the printed circuit board thereon, a rear part extending from the top part via a hem formed by folding back the steel sheet, for supporting a lower portion of the top part, and a bottom part extending from the rear part.

11 Claims, 8 Drawing Sheets

FRONT RAIL IN SUB-RACK

BACKGROUND OF THE INVENTION

1. Field of the Invention

The present invention relates to a front rail in a sub-rack, which acts as a cabinet in which a plurality of printed circuit boards packing electronic circuit assemblies are mountable, and which constitutes an electronic equipment unit such as a communication apparatus and so on.

2. Description of the Prior Art

FIG. 1 is a perspective view of the constitution of a conventional sub-rack. In FIG. 1, reference numeral 100 denotes a sub-rack. 101 denotes a top plate. 102 denotes a bottom plate. 103 denotes a side plate. 104 denotes a front rail arranged on front edges of the top plate 101 and the bottom plate 102, respectively. 105 denotes a mid-rail arranged on a midrange of the top plate 101 and the bottom plate 102, respectively, so as to cross the midrange. 106 denotes a guide rail whose both ends are mounted on upper faces of the front rail 104 and the mid-rail 105. 107 denotes a locating hole for locating a position on which a printed circuit board (not shown) is inserted.

FIG. 2 is a perspective view of the sub-rack 100 that a plug-in unit is partially mounted. In FIG. 2, 111 denotes a front panel constituting a front part of the sub-rack 100 when the printed circuit board (not shown) is mounted into the sub-rack 100. 112 denotes a handle mounted on the front panel 111 and used for the insertion of the printed circuit board (not shown) into the sub-rack 100 and for the removal thereof from the sub-rack 100. FIG. 3 is a side view of the constitution of the plug-in unit mounted into the sub-rack 100. In FIG. 3, since the common numerals denote common elements or the counterparts in FIG. 2, the description of such parts is omitted. 121 denotes a printed circuit board. 122 denotes a connector arranged on the printed circuit board 121, which is connectable by a plug-in type with another connector (not shown) on a back plane mounted on a rear part of the sub-rack 100. 123 denotes a guide pin which can be inserted into the locating hole 107 in order to locate the printed circuit board 121. 124 denotes a handle-supporting part which is connected with the printed circuit board 121 or the front panel 111. 125 denotes a pin which is fixed to the handle 112 or the handle-supporting part 124 to allow rotation of the handle 112 with respect to the handle-supporting part 124.

FIG. 4 is a drawing of the plug-in unit coupling with the front rail. In FIG. 4, since the common numerals denote common elements or the counterparts in FIGS. 1 to 3, the description of such parts is omitted. 131 denotes a first claw part of the handle 112, and 132 denotes a second claw part of the handle 112. 133 denotes a first engagement part formed on the front rail 104, and 134 denotes a second engagement part formed on the front rail 104.

The operation of this invention will be described as follows.

When the plug-in unit having the printed circuit board 121 is inserted into the sub-rack, the printed circuit board 121 is slid along a groove formed in the guide rail 106. The guide pin 123 arranged on the plug-in unit is then inserted into the locating hole 107 formed in the front rail 104 to locate the front panel 111 with respect to the front rail 104. Consequently, the handle 112 is rotated in a direction "A" in a state of engaging the first claw part 131 of the handle 112 with the first engagement part 133 of the front rail 104. The connector 122 of the printed circuit board 121 is then connected to the back plane to finish the insertion of the plug-in unit into the sub-rack 100.

When the plug-in unit is removed from the sub-rack 100, the handle 112 is rotated in a direction "B" in a state of engaging the second claw part 132 of the handle 112 with the second engagement part 134 of the front rail 104 to remove the connector 122 of the printed circuit board 121 from the back plane. Consequently, the printed circuit board 121 is pulled out along the groove formed in the guide rail 106 to remove the plug-in unit from the sub-rack 100.

The conventional sub-rack is constituted as described above. The front rail 104 is made of extruded aluminum materials. When a plurality of large-size printed circuit boards are mounted on the front rail 100, the front rail 100 bent, and the printed circuit board 121 disconnects from the groove of the guide rail 106 and falls to the bottom part of the sub-rack 100.

SUMMARY OF THE INVENTION

Accordingly, it is an object of the present invention to provide a front rail having a sufficient strength to hold a plurality of large-size printed circuit boards in required positions of a sub-rack.

In order to achieve the object of the present invention, a front rail in a sub-rack formed by bending a plate comprises a front part having a hole, the hole allowing insertion of a dowel pin, the dowel pin being arranged on a printed circuit board, a top part on which a guide rail for guiding the printed circuit board is mounted, a rear part extending from the top part via a hem formed by folding back a plate, the rear part for supporting a lower portion of the top part, and a bottom part extending from the rear part. As a result of such a pressing operation of one steel sheet and the arrangement of the hem, the front rail can obtain a sufficient strength. As a result, the front rail is hardly bent when the plurality of large-size printed circuit boards are mounted thereon, and it can prevent such boards from dropping out of the guide rail.

Here, the front part may come into contact with the bottom part the hem. The structural strength of the front rail can be therefore enhanced by the addition of the hem. It is easy to form the hem extending from the top part because the front part extends from the bottom part. Accordingly, the production of the front rail is facilitated.

The front rail may further comprise a plurality of engagement holes which are arranged on the hem extending from both the front and bottom parts. The claw part of the handle of the plug-in unit can easily engage with the engagement hole, and convenience of operation can be enhanced.

The front rail may further comprise a mounting part having a screw hole, the mounting part formed by bending a cantilever part in a lateral direction, wherein the cantilever part is integrated with the top part. The front rail can be therefore easily arranged in the sub-rack owing to a simple operation of connecting a bolt inserted into the side part of the sub-rack with the screw hole.

The front rail may further comprise a mounting part having a screw hole, the mounting part formed by bending a cantilever part in a lateral direction, wherein the cantilever part is integrated with the bottom part. Since the side parts of the sub-rack can sustain the downward load forcing on the bottom part to prevent the hem extending from the top part from opening, the stability of the front rail shape can be improved. Accordingly, aspects such as a positioning accuracy can be further improved.

The front rail may further comprise a mounting hole arranged on the hem extending from the top part, the mounting part for mounting a guide rail guiding the printed circuit board. Accordingly, it is possible to form the mounting hole by a series of sheet-metal processes including bending and so on. When compared with arranging a mounting member on the top part by another operation steps, the front rail in embodiment 1 can be manufactured at a low cost.

The front rail may further comprise a plurality of projections arranged on the rear edge side, the respective projections extending in a rear direction. The guide rail guiding the printed circuit board can be therefore mounted on the projections by forwardly moving the guide rail in a horizontal direction. Accordingly, the mounting of the guide rail on the front rail can be easily performed, and the structure of a guide rail-mounting part can be simplified which facilitates manufacture of the front rail. Since the guide rail is mounted relative to the projections, positional accuracy of the guide rail can be further improved.

The front rail may further comprise a screw-accommodating part formed by partially cutting and raising an articulated region defined between the rear part and the bottom part, and a female screw thread cut in an internal face of the screw-accommodating part. The front rail can be therefore easily arranged in the sub-rack by the simple operation of connecting the bolt inserted into the side part of the sub-rack with the screw hole formed at the screw-accommodating part. Since the screw-accommodating part is formed by only a cutting and raising operation, the structure of a guide rail-mounting part can be simplified which facilitates manufacture of the front rail.

A pole-type body may be inserted into a cavity partitioned by the front, the top, the rear and the bottom parts, the pole-type body having a height nearly equal to a distance between the top and the bottom parts. The structural strength of the front rail can be therefore enhanced because the pole-type body functions as a reinforcing member.

The front rail may further comprise a plurality of insertion holes formed in the pole-type body. The respective insertion holes allow dowel pins to be inserted. Since it is not necessary to take the collision of the pole-type body with the dowel pins into account, the width of the pole-type body as a reinforcing member can be therefore increased to a width of the cavity, and the area of the reinforcing member for supporting the top part can be increased. Accordingly, the structural strength of the front rail can be further enhanced.

The pole-type body may be hollow, and may be a rectangular in cross section but lacks one of four sides. Accordingly, the structural strength of the front rail can be further enhanced owing to such a simple structure while the dowel pin arranged on the printed circuit board can be adequately inserted into the cavity.

A screw plate may be inserted into a cavity partitioned by the front, the top, the rear and the bottom parts, the screw plate having a screw hole allowing insertion of dowel pins arranged on the printed circuit board. Electromagnetic shielding can be therefore enhanced while binding force between the plug-in unit and the front rail can be enhanced by screwing the dowel pin on the screw plate.

The front rail may further comprise an engagement part formed on the top part, the engagement part for engaging the screw plate within the cavity. Insertion of the screw plate into the cavity can be easily performed, and a tip or tilt of the screw plate can be prevented which facilitates the screwing operation of the guide pin.

DESCRIPTION OF THE PREFERRED EMBODIMENT OF THE INVENTION

Embodiments according to the present invention will be described below.

Embodiment 1

Figure 1:
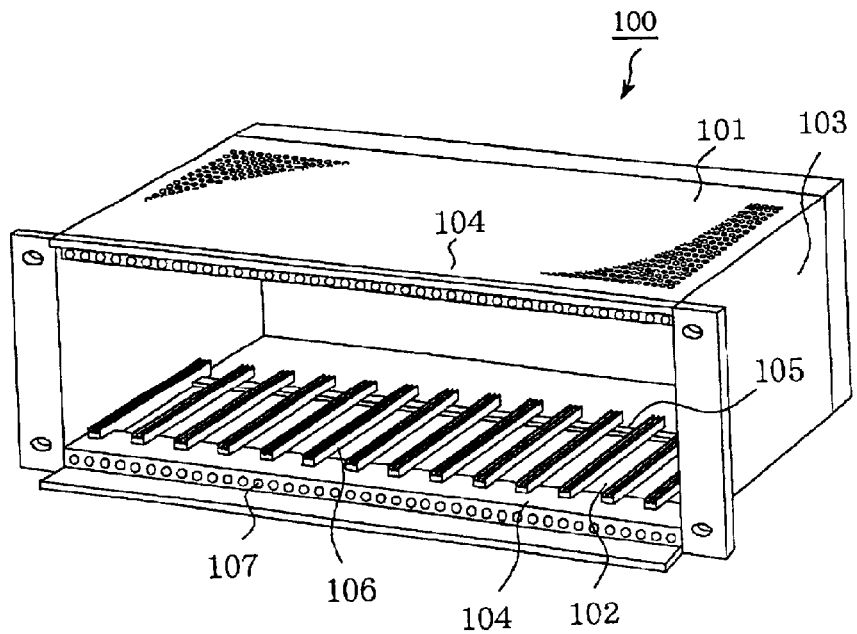
FIG. 1 is a perspective view of the constitution of a conventional sub-rack.
Figure 2:
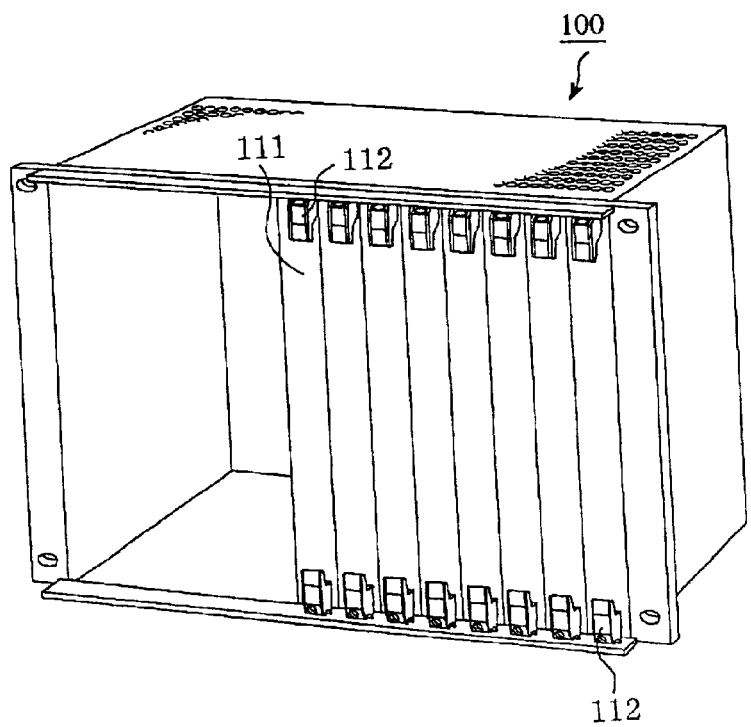
FIG. 2 is a perspective view of the sub-rack 100 in which a plug-in unit is partially mounted.
Figure 3:
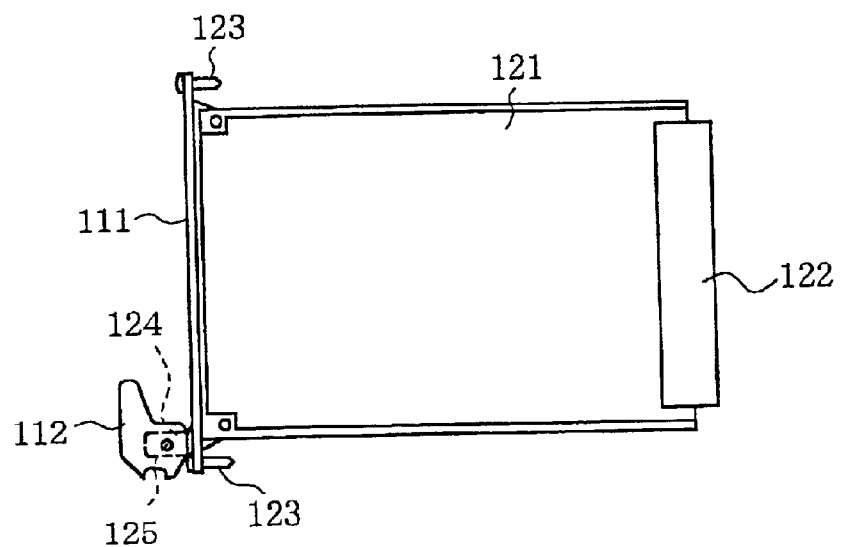
FIG. 3 is a side view of the constitution of the plug-in unit mounted into the sub-rack.
Figure 4:
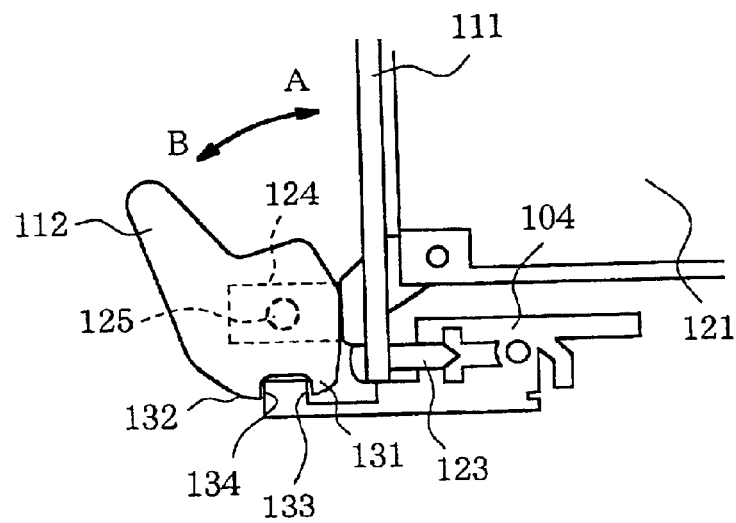
FIG. 4 is a drawing of a state of coupling the plug-in unit with the front rail.
Figure 5:
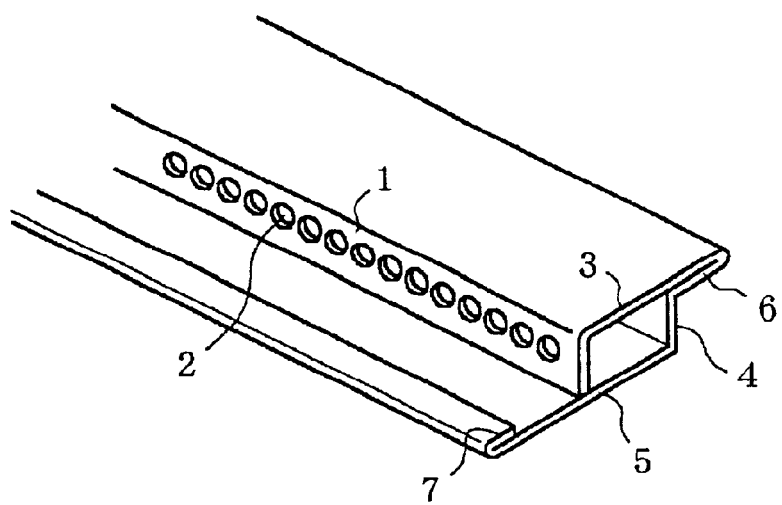
FIG. 5 is a perspective view of a front rail in a sub-rack in embodiment 1 according to the present invention.

FIG. 5 is a perspective view of a front rail in a sub-rack in embodiment 1 according to the present invention. In FIG. 5, 1 denotes a front part. 2 denotes a locating hole (hole) formed on the front part 1, into which a guide pin as a dowel pin of the plug-in unit can be inserted. 3 denotes a top part mounting ends of the guide rail for guiding the printed circuit board. 4 denotes a rear part disposed so as to support the top part 3. 5 denotes a bottom part extending from the rear part 4. 6 denotes a hem formed by folding back a steel sheet (plate) and extending from the top part 3 and the rear part 4. Similarly, 7 denotes a bending edge part constituted by a hem formed by folding back a steel sheet, both ends of the bending edge part 7 having engagement parts for engaging with the claws of the handle in the plug-in unit. The front part 1, the top part 3, the hem 6, the rear part 4, the bottom part 5 and the bending edge part 7 are formed by bending the plate made of steel sheets and so on.

As described above, the front rail in the sub-rack in embodiment 1 is formed by bending the steel sheet. The front rail also includes a front part 1 having a hole 2 allowing insertion of a dowel pin arranged on a printed circuit board, a top part 3 mounting a guide rail for guiding the printed circuit board thereon, a rear part 4 extending from the top part 3 via a hem 6 formed by folding back the steel sheet, the rear part 4 for supporting a lower portion of the top part 3, and a bottom part 5 extending from the rear part 4. As a result of such bending of one steel sheet and the arrangement of the hem, the front rail can obtain a sufficient strength. The front rail is hardly bent when the plurality of large-size printed circuit boards are mounted thereon, and as a result it can prevent such boards from dropping out of the guide rail.

Embodiment 2

Figure 6:
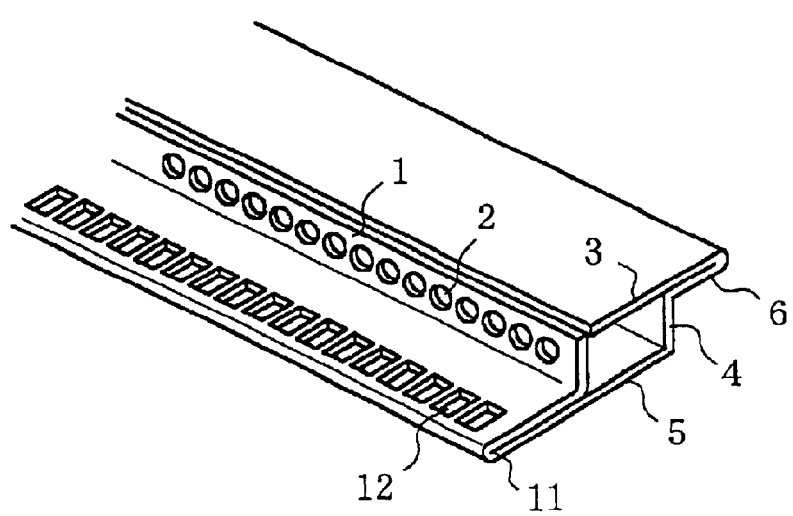
FIG. 6 is a perspective view of a front rail in a sub-rack in embodiment 2 according to the present invention.

FIG. 6 is a perspective view of a front rail in a sub-rack in embodiment 2 according to the present invention. In FIG. 6, since the common numerals denote common elements or the counterparts in FIG. 5, the description of such parts is omitted. 11 denotes a hem formed by folding back the steel sheet at the bottom part 5. 12 denotes an engagement hole formed as a through hole by a punching operation, the engagement hole having engagement parts which can be engaged with the claw parts of the handle of the plug-in unit, the respective engagement parts arranged at front and rear edges of the engagement hole 12.

The front rail in embodiment 2 is characterized in that the front part 1 extends from the bottom part 5 via the hem 11. When the front part 1 extends from the top part 3 in the front rail in embodiment 1, a tool used for pressing and tapping on a bending portion of the hem 6 interferes with the front part 1 when the hem 6 extends from the top part 3 is formed. It is therefore difficult to manufacture such a front rail. On the other hand, it is ease to form the hem 11 in embodiment 2 because the front part 1 extends from the bottom part 5. Since the engagement hole 12 is formed on the hem 11, the engagement part for engaging with the claw parts of the handle of the plug-in unit has a depth corresponding to a thickness of 2 sheets of the steel sheet. The engagement between the engagement part and the claw parts can be firmly constructed.

As described above, with the front rail in the sub-rack in embodiment 2, the front part 1 extends from the bottom part 5 via the hem 11. The structural strength of the front rail can be therefore enhanced according to the addition of the hem 11. It is ease to form the hem 11 extends from the top part 3 because the front part 1 extends from the bottom part 5, and accordingly the production of the front rail can be easily performed. Since the plurality of the engagement holes 12 acting as through holes are further formed in the hem 11 extends from the bottom part 5, the claw part of the handle of the plug-in unit can easily engage with the engagement hole, and convenience of operation can be enhanced.

Embodiment 3

Figure 7:
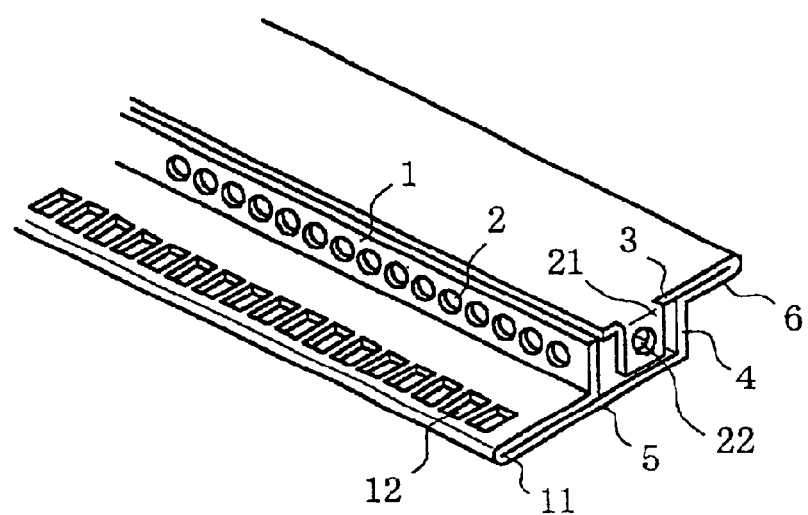
FIG. 7 is a perspective view of a front rail in a sub-rack in embodiment 3 according to the present invention.

FIG. 7 is a perspective view of a front rail in a sub-rack in embodiment 3 according to the present invention. In FIG. 7, since the common numerals denote common elements or the counterparts in FIG. 6, the description of such parts is omitted. 21 denotes a mounting part formed by bending a piece of the steel sheet (cantilever part) integrated with the top part 3 in order to couple the front rail to side parts of the sub-rack. 22 denotes a screw hole formed in the mounting part 21, which can be connected with a bolt inserted into the side part of the sub-rack in order to couple to the front rail.

As described above, with the front rail in the sub-rack in embodiment 3, the mounting part 21 having the screw hole 22 is formed by bending the steel sheet integrated with the top part 3. The front rail can be therefore easily arranged in the sub-rack owing to a simple operation of connecting the bolt inserted into the side part of the sub-rack with the screw hole 22.

Embodiment 4

Figure 8:
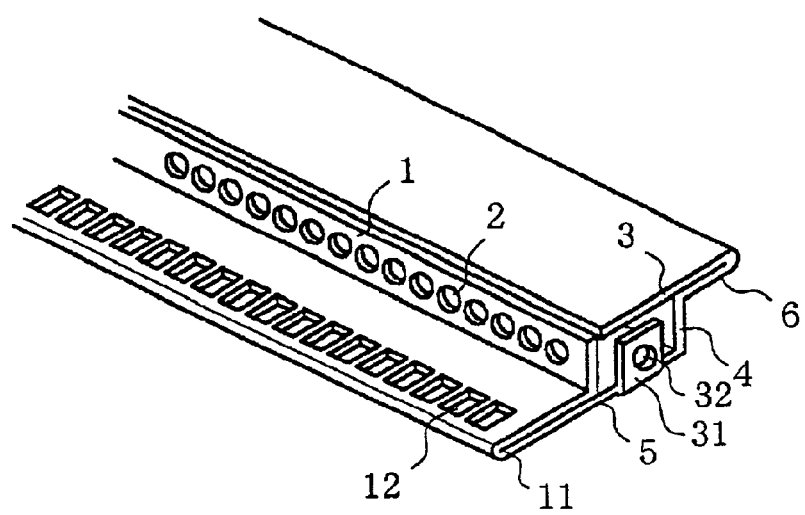
FIG. 8 is a perspective view of a front rail in a sub-rack in embodiment 4 according to the present invention.

FIG. 8 is a perspective view of a front rail in a sub-rack in embodiment 4 according to the present invention. In FIG. 8, since the common numerals denote common elements or the counterparts in FIG. 6, the description of such parts is omitted. 31 denotes a mounting part formed by bending a piece of the steel sheet (cantilever part) integrated with the bottom part 5 in order to couple the front rail to the side parts of the sub-rack. 32 denotes a screw hole formed in the mounting part 31, which can be connected with a bolt inserted into the side part of the sub-rack in order to couple to the front rail.

With the structure of the front rail in embodiment 3, under a downward load forced via a guide pin inserted into the locating hole 2, the hem 6 is opened to alter the shape of the front rail. On the other hand, with the structure of front rail in embodiment 4, the side parts of the sub-rack can sustain the downward load forced via the guide pin. Accordingly, the stability of the front rail shape can be improved without opening the hem 6.

As described above, the front rail in the sub-rack in embodiment 4 can obtain the same effects in embodiment 3. With the front rail in embodiment 4, since the side parts of the sub-rack can sustain the downward load on the bottom part 5 which prevents the hem 6 extends from the top part 3 from opening, the stability of the front rail shape can be improved. Accordingly, aspects such as positional accuracy can be further improved.

Embodiment 5

Figure 9:
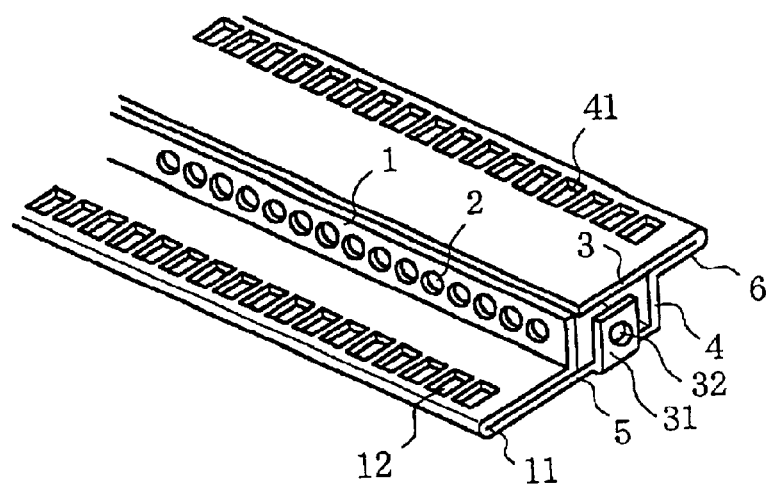
FIG. 9 is a perspective view of a front rail in a sub-rack in embodiment 5 according to the present invention.

FIG. 9 is a perspective view of a front rail in a sub-rack in embodiment 5 according to the present invention. In FIG. 9, since the common numerals denote common elements or the counterparts in FIG. 8, the description of such parts is omitted. 41 denotes a through hole formed by punching the top part 3 or the hem 6 extends from the top part 3, or a mounting hole for mounting a guide rail formed as a depression by a drawing operation. The mounting hole 41 is formed by a series of sheet-metal operations including bending and so on.

As described above, the front rail in the sub-rack in embodiment 5 can obtain the same effects in embodiment 4. With the front rail in embodiment 5, the mounting hole 41 for mounting the guide rail guiding the printed circuit board is arranged at the hem 6 extends from the top part 3. Accordingly, it is possible to form the mounting hole 41 by a series of sheet-metal operations including a bending working and so on. As compared with arranging a mounting member on the top part 3 by other operations, the front rail in embodiment 5 can be manufactured at a low cost.

Embodiment 6

Figure 10:
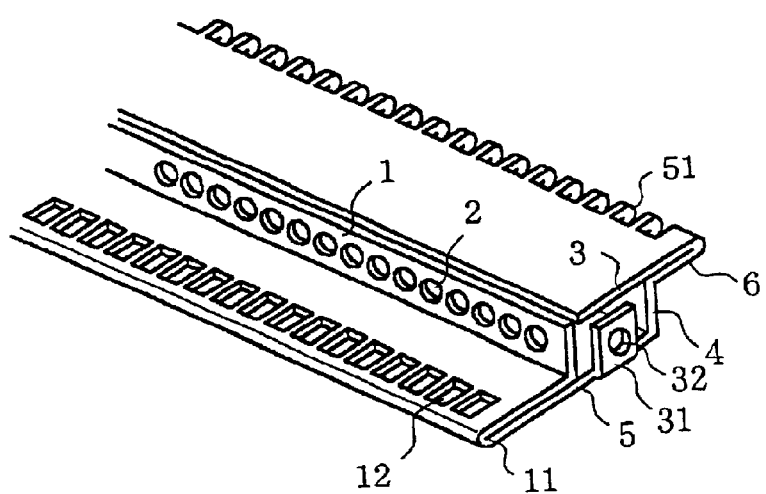
FIG. 10 is a perspective view of a front rail in a sub-rack in embodiment 6 according to the present invention.

FIG. 10 is a perspective view of a front rail in a sub-rack in embodiment 6 according to the present invention. In FIG. 10, since the common numerals denote common elements or the counterparts in FIG. 8, the description of such parts is omitted. 51 denotes a plurality of projections formed at the rear edge of the hem 6 by cutting the rear edge thereof. These projections are preferably formed with a required pitch. In this case, the rear edge of the hem 6 has a comb-shape owing to the projections 51 formed with the required pitch. Thus, since the plurality of projections 51 are provided at the rear edge side of the hem 6 so as to extend in a rear direction, the guide rail guiding the printed circuit board can be mounted on the projections 51 by forwardly moving the guide rail in a horizontal direction.

As described above, the front rail in the sub-rack in embodiment 6 can obtain the same effects in embodiment 4. With the front rail in embodiment 6, the plurality of projections 51 extending in the rear direction are arranged at the rear edge side of the hem 6 extends from the top part 3. The guide rail guiding the printed circuit board can be therefore mounted on the projections 51 by forwardly moving the guide rail in a horizontal direction. Accordingly, the mounting of the guide rail on the front rail can be easily performed, and the structure of a guide rail-mounting part can be simplified to facilitate manufacture of the front rail. Since the guide rail is mounted relative to the projections 51, the positional accuracy of the guide rail can be further improved.

Embodiment 7

Figure 11:
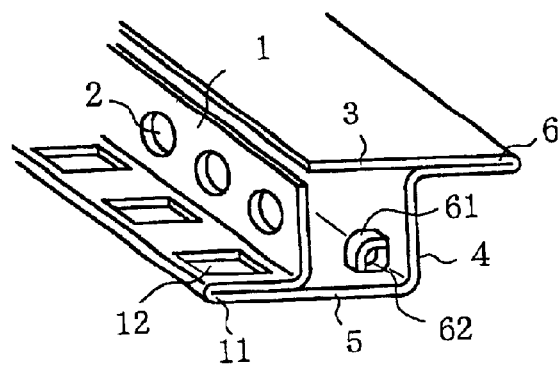
FIG. 11 is a perspective view of a front rail in a sub-rack in embodiment 7 according to the present invention.

FIG. 11 is a perspective view of a front rail in a sub-rack in embodiment 7 according to the present invention. In FIG. 11, since the common numerals denote common elements or the counterparts in FIG. 6, the description of such parts is omitted. 61 denotes a screw-accommodating part formed with an appropriate width by partially cutting and raising an articulated region defined between the rear part 4 and the bottom part 5. A female screw thread is cut in an internal face of the screw-accommodating part 61. 62 denotes a screw hole, which can be connected with a bolt inserted into the side part of the sub-rack in order to couple to the front rail.

As described above, according to embodiment 7, the screw-accommodating part 61 is formed by partially cutting and raising an articulated region defined between the rear part 4 and the bottom part 5, with the female screw thread cut in the internal face of the screw-accommodating part 61. The front rail can be therefore easily arranged in the sub-rack by a simple operation of connecting the bolt inserted into the side part of the sub-rack with the screw hole 62 formed at the screw-accommodating part 61. Since the screw-accommodating part 61 is formed by only cutting and raising operation, the structure of a guide rail-mounting part can be simplified and facilitates manufacture of the front rail.

Embodiment 8

Figure 12:
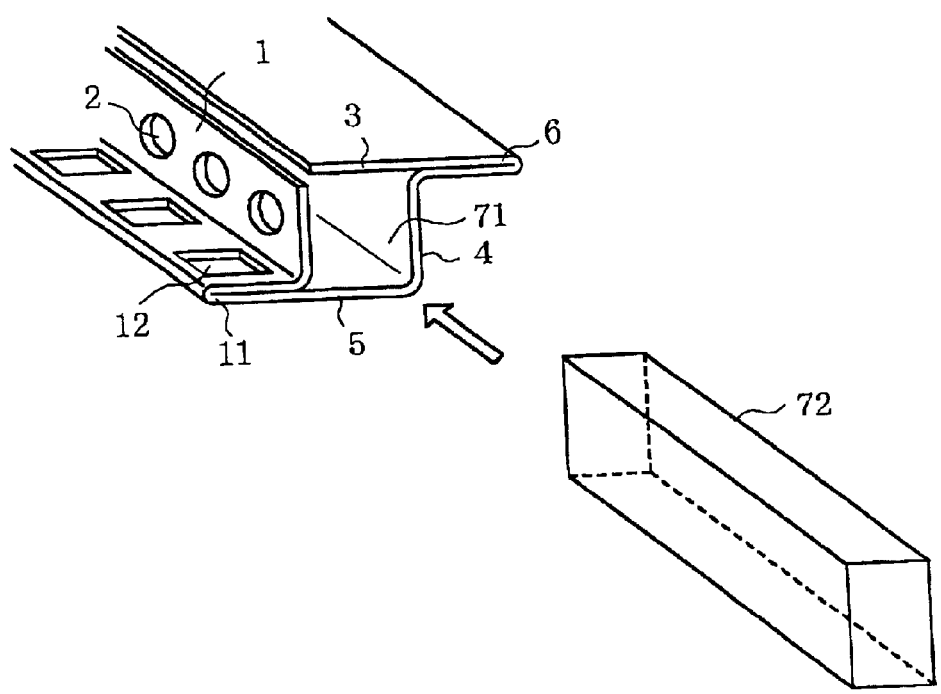
FIG. 12 is a perspective view of a front rail and a reinforcing member in a sub-rack in embodiment 8 according to the present invention.

FIG. 12 is a perspective view of a front rail and a reinforcing member in a sub-rack in embodiment 8 according to the present invention. In FIG. 12, since the common numerals denote common elements or the counterparts in FIG. 6, the description of such parts is omitted. 71 denotes a cavity partitioned by the front part 1, the top part 3, the rear part 4 and the bottom part 5. 72 denotes a reinforcing member comprising a pole-type body made of materials such as steel and so on. The reinforcing member 72 is inserted into the cavity 71, and has a height nearly equal to a distance between the top part 3 and the bottom part 5. It should be noted that a sectioned shape is limited to a rectangular shape, and that the reinforcing member may take any shape, whose height is nearly equal to a distance between the top part 3 and the bottom part 5.

As described above, with embodiment 8, the reinforcing member 72 has a height nearly equal to a distance between the top part 3 and the bottom part 5. The reinforcing member 72 is inserted into the cavity 71 partitioned by the front part 1, the top part 3, the rear part 4 and the bottom part 5. The structural strength of the front rail can be therefore enhanced.

Embodiment 9

Figure 13:
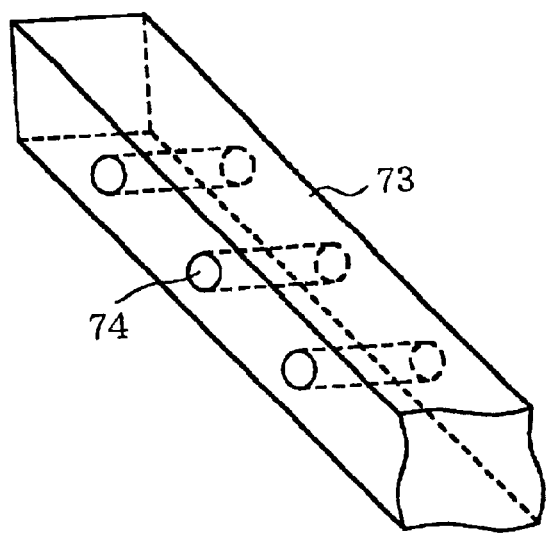
FIG. 13 is a perspective view of a reinforcing member used for a front rail in a sub-rack in embodiment 9 according to the present invention.

FIG. 13 is a perspective view of a reinforcing member used for a front rail in a sub-rack in embodiment 9 according to the present invention. In FIG. 13, since the common numerals denote common elements or the counterparts in FIG. 6, the description of such parts is omitted. 73 denotes a reinforcing member comprising a pole-type body made of materials such as steel and so on. The reinforcing member 73 is inserted into the cavity 71, and has a height nearly equal to a distance between the top part 3 and the bottom part 5. 74 denotes an insertion hole formed in the reinforcing member 73, and is inserted by a guide pin arranged on the printed circuit board.

With the front rail in embodiment 8, it is necessary to narrow the width of the reinforcing member 72 so that the guide pin can be adequately inserted into the cavity 71 without the reinforcing member 72 interfering with the insertion of the guide pin via the locating hole 2. On the other hand, with the front rail in embodiment 9, since the insertion hole 74, allowing insertion of the guide pin, is provided in the reinforcing member 73, the width of the reinforcing member 73 can be increased to a width of the cavity 71.

As described above, with embodiment 9, the insertion hole 74, which can be inserted by the guide pin, is provided in the reinforcing member 73. The width of the reinforcing member 73 can be therefore increased to a width of the cavity 71, and the area of the reinforcing member 73 for supporting the top part 3 can be increased. Accordingly, the structural strength of the front rail can be further enhanced.

Embodiment 10

Figure 14:
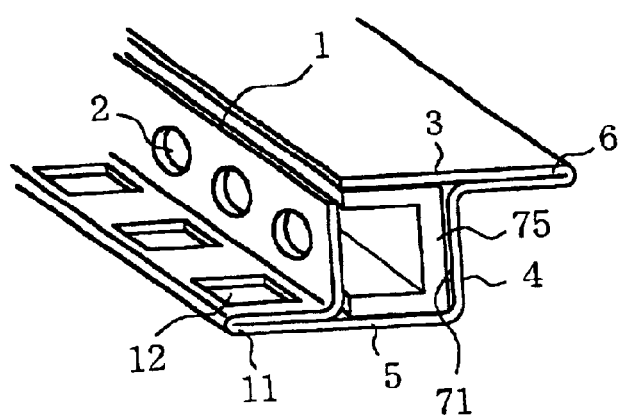
FIG. 14 is a perspective view of a front rail and a reinforcing member in a sub-rack in embodiment 10 according to the present invention.

FIG. 14 is a perspective view of a front rail and a reinforcing member in a sub-rack in embodiment 10 according to the present invention. In FIG. 14, since the common numerals denote common elements or the counterparts in FIG. 6, the description of such parts is omitted. 75 denotes a reinforcing member comprising a pole-type body made of materials such as steel and so on. The reinforcing member 75 is inserted into the cavity 71, and has a height nearly equal to a distance between the top part 3 and the bottom part 5. The reinforcing member 75 is hollow, and is a rectangular in cross section but lacks one of four sides.

As described above, with embodiment 10, the reinforcing member 75, which is a rectangular in cross section but lacks one of four sides, is inserted into the cavity 71 partitioned by the front part 1, the top part 3, the rear part 4 and the bottom part 5. Accordingly, the structural strength of the front rail can be further enhanced owing to such a simple structure while the guide pin can be adequately inserted into the cavity 71.

Embodiment 11

Figure 15:
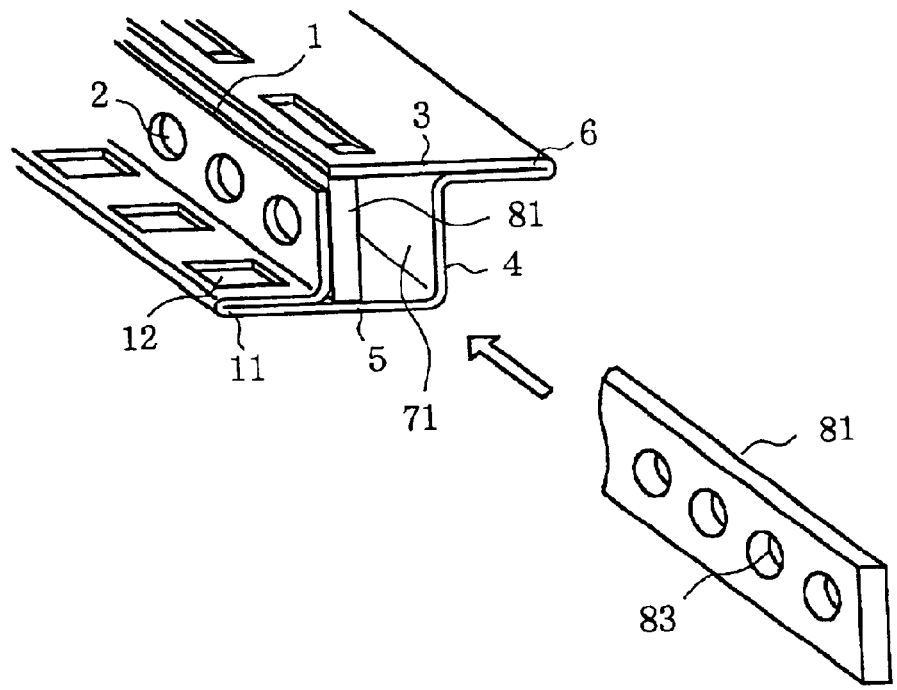
FIG. 15 is a perspective view of a front rail in a sub-rack in embodiment 11 according to the present invention.
Figure 16:
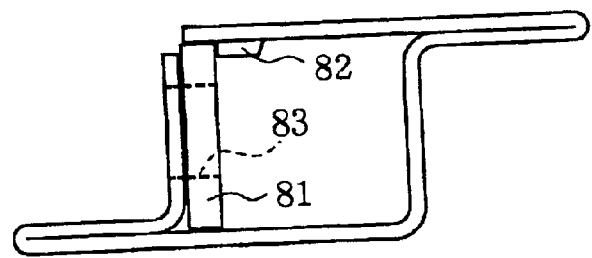
FIG. 16 is a side view of a front rail in a sub-rack in embodiment 11 according to the present invention.

FIG. 15 is a perspective view of a front rail in a sub-rack in embodiment 11 according to the present invention. FIG. 16 is a side view of the front rail in the sub-rack in embodiment 11 according to the present invention. In FIGS. 15 and 16, since the common numerals denote common elements or the counterparts in FIG. 6, the description of such parts is omitted. 81 denotes a screw plate which has a height nearly equal to a distance between the top part 3 and the bottom part 5, and which is inserted into the cavity 71. 82 denotes an engagement part formed on the top part 3 by a drawing operation in order to engage the screw plate 81 within the cavity 71. 83 denotes a screw hole formed in the screw plate 81, which can be connected with a male thread formed at an end of the guide pin.

As described above, with embodiment 11, the screw plate 81 having the screw hole 83, which can be connected with the male thread formed at the guide pin arranged on the printed circuit board, is inserted into the cavity 71. Electromagnetic shielding can be therefore enhanced while binding force between the plug-in unit and the front rail can be enhanced by screwing the guide pin on the screw plate 81. The engagement part 82 is formed on the top part 3 in order to engage the screw plate 81 within the cavity 71. Insertion of the screw plate 81 into the cavity 71 can be easily performed, and a tip or tilt of the screw plate 81 can be prevented which facilitates the screwing operation of the guide pin.

The present invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A front rail configured to be formed by bending a piece of a plate for a sub rack, the front rail comprising:
    a front part defining a plurality of holes configured to receive pins arranged on plug-in units;
    a top part;
    a rear part configured to support the top part;
    a bottom part;
    a first hem extending from the top part, the first hem defining a plurality of projections configured to receive rails to guide the plug-in units; and
    a second hem extending from the bottom part, the second hem defining a plurality of voids configured to receive handles of the plug-in units,
    wherein the front part, the top part, the rear part, and the bottom part define a partially closed volume having a rectangular cross section, the first hem extends from the volume in a first direction, and the second hem extends from the volume in a second direction opposite the first direction.

2. The front rail according to claim 1, wherein the second hem is disposed adjacent the front part.

3. The front rail according to claim 2, wherein the plurality of voids defined by the second hem extends through the second hem.

4. The front rail according to claim 2, further comprising:
    a mounting part defining a screw hole, the mounting part formed by bending a cantilever part in a lateral direction, wherein the cantilever part is integrated with the bottom part.

5. The front rail according to claim 1, wherein the first hem includes a first layer, a second layer, and a fold disposed between the first layer and the second layer.

6. The front rail according to claim 1, wherein the bottom part extends from the rear part towards the front part.

7. The front rail according to claim 1, wherein the bottom part is parallel to and spaced a distance apart from the top part and the rear part is parallel to and spaced a distance apart from the front part.

8. A front rail configured to be disposed at a front edge portion of a sub-rack, the front rail comprising:
    a front part, a top part, a rear part, a bottom part, a first hem extending from the top part, the first hem defining a plurality of projections configured to receive rails to guide plug-in units including circuit boards, and a second hem extending from the bottom part, all of which are formed by bending a piece of a plate, the front part, the top part, the rear part, and the bottom part defining a partially closed volume having a rectangular shape, the first hem extending from the closed volume in a first direction, the second hem extending from the closed volume in a second direction opposite to the first direction, wherein:
        the first and second hems are formed by folding the plate; and
        the front part defines a plurality of holes configured to receive pins arranged on the plug-in units.

9. The front rail according to claim 8, wherein the front part contacts the bottom part through one of the hems.

10. The front rail according to claim 9, further comprising:
    a plurality of engagement holes arranged on at least one of the hems extending from both the front and bottom parts.

11. The front rail according to claim 9, further comprising:
    a mounting part defining a screw hole, the mounting part formed by bending a cantilever part in a lateral direction, wherein the cantilever part is integrated with the bottom part.

* * * * *